United States Patent [19]

Emnett et al.

[11] Patent Number: 5,576,640
[45] Date of Patent: Nov. 19, 1996

[54] CMOS DRIVER FOR FAST SINGLE-ENDED BUS

[75] Inventors: Raymond F. Emnett; Eugene E. Freeman; Mark J. Jander; William K. Petty; Brian G. Reise; Kevin M. Rishavy, all of Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 952,674

[22] Filed: Sep. 25, 1992

[51] Int. Cl.$^6$ .................................. H03K 19/0175
[52] U.S. Cl. .................................. 326/83; 326/30; 326/86
[58] Field of Search .................................. 307/263, 443, 307/975; 326/83, 86, 30

[56] References Cited

U.S. PATENT DOCUMENTS

| | | | |
|---|---|---|---|
| 4,045,684 | 8/1977 | Eads | 307/443 |
| 4,404,474 | 9/1983 | Dingwall | 307/443 |
| 4,498,021 | 2/1985 | Uya | 326/17 |
| 4,638,187 | 1/1987 | Boler et al. | 307/451 |
| 4,725,747 | 2/1988 | Stein | 307/443 |
| 4,728,827 | 3/1988 | Woo | 307/443 |
| 4,748,426 | 5/1988 | Stewart | 307/443 |
| 4,825,101 | 4/1989 | Walters, Jr. | 307/270 |
| 4,885,485 | 12/1989 | Leake et al. | 307/443 |
| 4,959,565 | 9/1990 | Knecht | 307/443 |
| 4,972,100 | 11/1990 | Lim et al. | 307/443 |
| 5,089,722 | 2/1992 | Amedeo | 307/443 |

*Primary Examiner*—Edward P. Westin
*Assistant Examiner*—Andrew Sanders
*Attorney, Agent, or Firm*—Wayne P. Bailey; James M. Stover

[57] ABSTRACT

An improved CMOS driver circuit for driving a fast, single-ended, wired-or bus architecture. The driver circuit provides a user-selectable active deassertion assist feature which assists a passive terminator circuit in quickly pulling-up a data or control bus line. The resulting driver circuit provides greater noise immunity to negative voltage transients that result from impedance mismatches caused by poor cable design configurations.

36 Claims, 4 Drawing Sheets

CMOS DRIVER FOR FAST SINGLE-ENDED BUS

The present invention relates to circuits for driving data and control buses and, more particularly, to an improved CMOS driver circuit for driving a single-ended, wired-or bus architecture such as a small computer system interface bus.

BACKGROUND OF THE INVENTION

A constant goal in the development of computer hardware is to design equipment that operates at faster speeds, and therefore, at higher operating frequencies. A fundamental result of increasing the operating frequency of a computer is that machine-cycle time periods must correspondingly decrease. In order to take advantage of the increased processing speeds that have been achieved thus far, it has been necessary to develop data transfer devices that can transfer data at higher data rates, i.e., operate with shorter machine-cycle time periods.

One such data transfer device is the small computer system interface (SCSI). The SCSI is an eight-bit parallel I/O bus that provides a host computer with device independence within a given class of devices. This means that different disk drives, tape drives, printers and communication devices can be added to a host computer without major modifications to the system hardware or software. The SCSI bus provides two different types of configurations: single-ended and differential. The single-ended driver and receiver configuration uses TTL (transistor-transistor logic) logic levels and is primarily intended for cabling applications of up to 6 meters while the differential configuration uses EIA RS-485 signals and is primarily intended for cabling applications of up to 25 meters.

Single-ended bus configurations are normally terminated with a terminator circuit which passively restores a bus line to a nominal 3.3 volts following an active low assertion of the bus line by a driver circuit. An exemplary terminator circuit is shown in FIG. 5. The bus line is passively restored by the voltage divider network comprised of a 220 ohm resistor and a 330 ohm resistor. Typically, the terminated bus line is restored passively to the voltage level developed across the 330 ohm resistor.

Single-ended buses, also referred to as terminated buses, are commonly arranged in a "wired-or" bus configuration. A wired-or bus configuration refers to a bus architecture having a number of line driver circuits coupled to a single bus line. Each line driver circuit that is coupled to the bus line independently asserts and deasserts the bus line for its own purposes.

The most common cabling induced problem associated with single-ended, wired-or bus configurations, such as the SCSI configuration, is the double-clocking of data bytes that occurs at the receiving end of the single-ended bus. The double-clocking problem is due to negative voltage reflections that are encountered by the receiver circuit during the deassertion (low-to-high transition) of a bus signal by the driver circuit at the transmitting end of the bus. The voltage reflections are due to impedance mismatches that occur as a result of poor cable design configurations.

An example of the double-clocking problem is shown in FIG. 3. Line A of FIG. 3 represents the passive reassertion (passive level restoration) of a bus signal by a typical terminator circuit (see FIG. 5). As the voltage level on the bus rises above the receiver threshold level, the output of the receiver (line B) goes high until a negative voltage reflection on the bus line temporarily drives the voltage level of bus line below the receiver threshold, thus causing the output of the receiver to temporarily go low. Once the negative undershoot has passed, the bus line is restored to a high level thereby driving the receiver output high once again.

Accordingly, there is a need for an improved CMOS driver circuit for driving a fast, single-ended, wired-or bus architecture which reduces the magnitude of the voltage reflections on a bus line caused by poor cable designs. Further, there is a need for an improved CMOS line driver circuit for driving a fast, single-ended, wired-or bus architecture which prevents negative voltage reflections from driving a bus line below the threshold level of a receiver coupled to the bus line.

OBJECTS OF THE INVENTION

It is therefore an object of the present invention to provide a new and useful CMOS driver circuit which operates with shorter machine-cycle time periods.

It is another object of the present invention to provide a CMOS driver circuit that is configurable to handle poor cable design configurations.

It is yet another object of the present invention to provide a CMOS driver circuit which reduces the magnitude of voltage reflections that travel across a bus line.

It is still a further object of the present invention to provide a CMOS driver circuit which provides a better high level noise margin thereby preventing negative voltage reflections from causing double-clocking problems.

SUMMARY OF THE INVENTION

There is provided in accordance with the present invention, an improved CMOS driver circuit for driving a fast, single-ended, wired-or bus architecture. The driver circuit includes an active deassertion device connected to a bus line that is terminated with a passive terminator circuit. The active deassertion device assists the passive terminator circuit in restoring the bus line to a first voltage level from a second voltage level.

In accordance with another aspect of the invention, the CMOS driver circuit further includes an assertion device connected to the terminated bus for asserting the first voltage level on the terminated bus, and a first control means connected to the active reassertion assist device for activating the deassertion assist device in response to a first enable signal that is generated by the assertion device. The first enable signal indicates when the assertion device has substantially completed asserting the first voltage level on the terminated bus.

In another embodiment of the present invention, a terminated bus system is disclosed wherein the above-mentioned driver circuit and terminator circuit are coupled to a bus line. The driver circuit further includes a quick turn-off device and a second control means. The quick turn-off device is connected to the assertion device for quickly turning off the assertion device in response to a turn-off signal generated by the second control means. The second control means controls the assertion device and the quick turn-off device in response to an input signal. A user-selectable second enable signal is coupled to the first control means for enabling and disabling the active deassertion assist device. Further, a control signal is coupled between the first control means and the second control means for enabling the active reassertion assist device when the assertion device is disabled.

DETAILED DESCRIPTION OF THE PREFERRED EMBODIMENT

Figure 1:
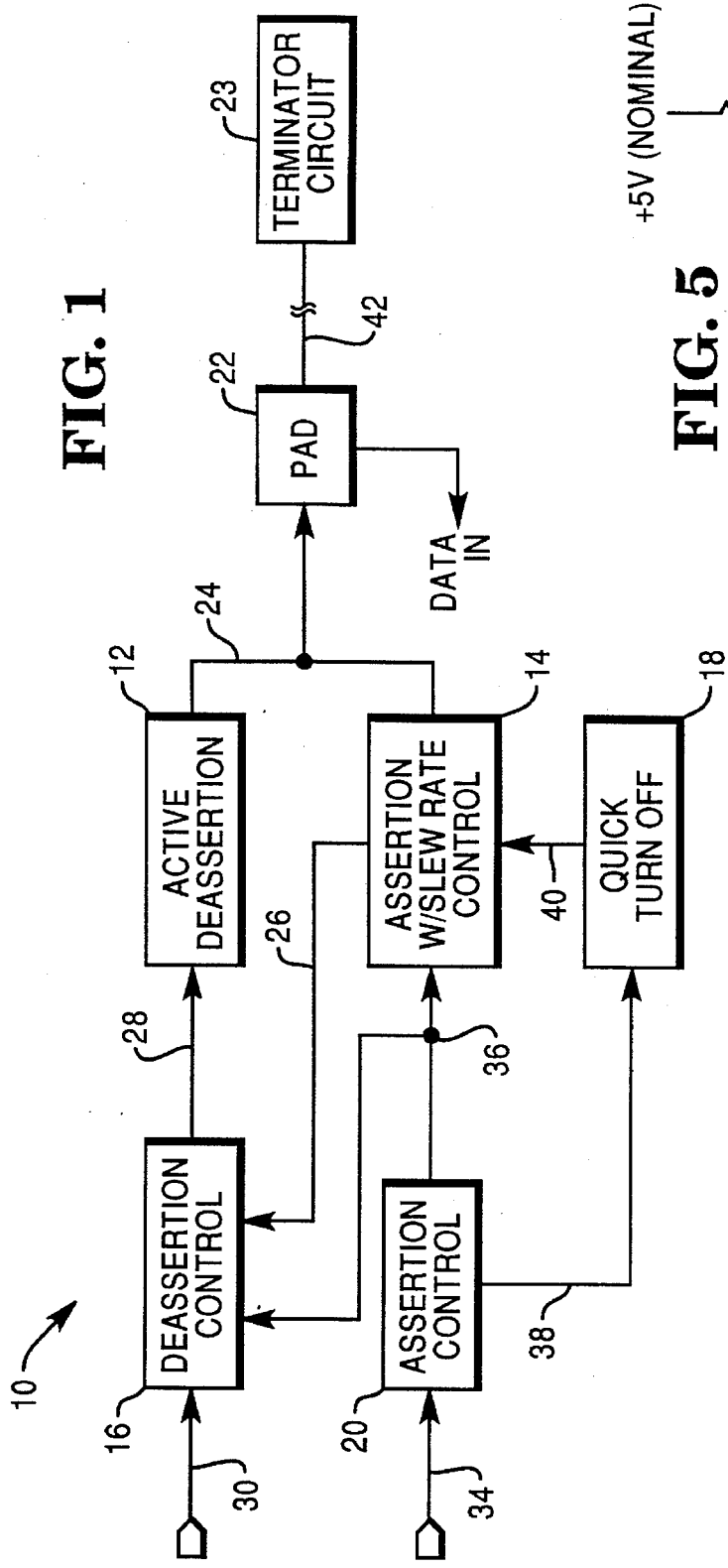
FIG. 1 is a block diagram illustration of a CMOS driver circuit in accordance with the present invention.
Figure 5:
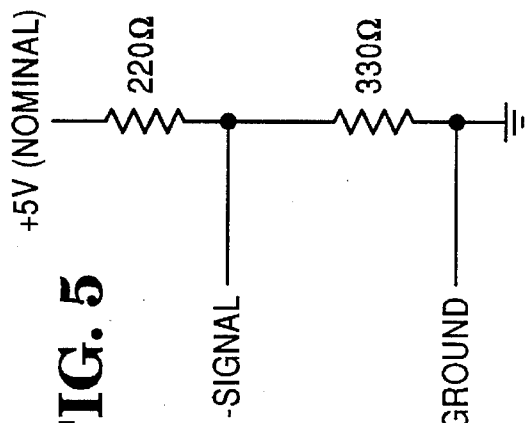
FIG. 5 is an illustration of a typical passive terminator circuit for terminating a single-ended bus line.

A CMOS driver circuit 10 of the present invention is shown in block diagram form in FIG. 1. The circuit includes an assertion device 14 and active reassertion assist device 12 for pulling down (asserting) and assisting in pulling up (deasserting), respectively, the voltage level of a data or control bus 42. An output line 24 and a PAD cell 22 couple the assertion device 14 and the active deassertion assist device 12 to the bus line 42.

A deassertion control 16 is provided for energizing active deassertion assist device 12 in the presence of a user enable signal 30, a control signal 36, and a deassertion enable signal 26.

An assertion control 20 is provided for energizing and de-energizing assertion device 14 via control signal 36. Control signal 36 is generated by assertion control 20 in response to an input signal received on an input line 34. Control signal 36 is further coupled to deassertion control 16. In operation, control signal 36 simultaneously enables assertion device 14 and disables active deassertion assist device 12 via deassertion control 16 when a high (logical one) input signal is received on input line 34. This prevents active deassertion assist device 12 and assertion device 14 from being energized at the same time. Similarly, control signal 36 simultaneously disables assertion device 14 and enables active deassertion assist device 12 via deassertion control 16 when a low (logical zero) input signal is received on input line 34.

Assertion control 20 likewise energizes and de-energizes a quick turn-off device 18 via quick turn-off signal 38 in response to an input signal received on input line 34. In operation, assertion control 20 energizes quick turn-off device 18 in response to a low input signal received on input line 34. When energized, quick turn-off device 18 assists assertion device 14 in quickly turning off in order that active reassertion assist device 12 may more effectively assist terminator circuit 23 in deasserting the low signal on bus line 42.

Deassertion enable signal 26 is coupled to deassertion control 16 when assertion network 14 has substantially completed asserting a low signal level on bus line 42.

User enable signal 30 is a user selectable signal for enabling and disabling the active deassertion assistance feature of the driver circuit 10. One instance when this feature would be selected by a user is when it is determined that impedance mismatches in the communication cables are causing data transfer errors to occur.

When both enable signals, 26 and 30, and control signal 36, are present at deassertion control 16, deassertion control 16 will energize active reassertion assist device 12 via line 28. Active deassertion assist device 12 will then couple Vcc supply voltage to bus line 42 via PAD cell 22 and output line 24 in order to actively assist passive terminator circuit 23 in reasserting the active low signal on bus line 42.

Figure 2A:
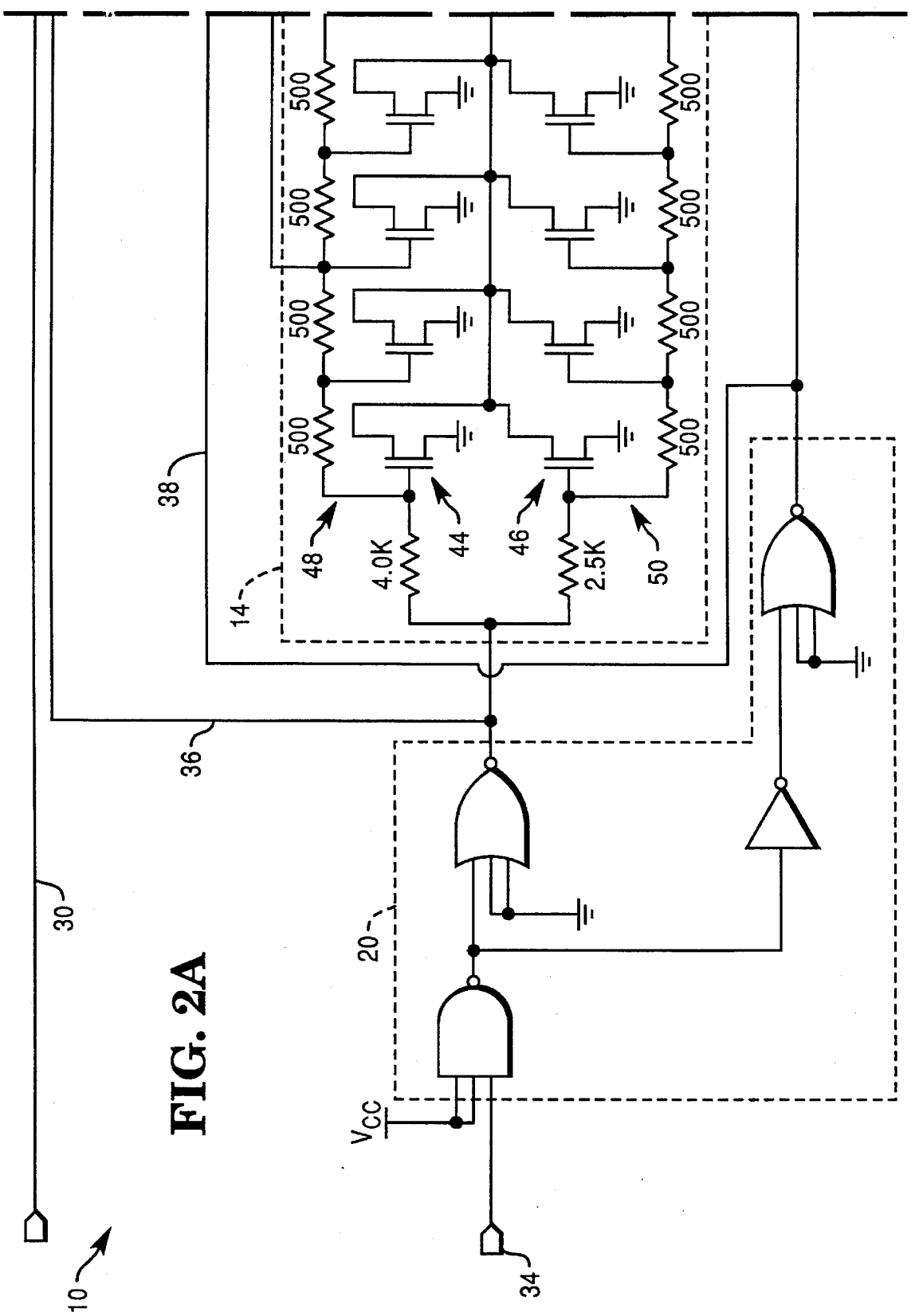
FIGS. 2A–2B are a schematic diagram of the preferred embodiment the CMOS driver circuit of the present invention.
Figure 2B:
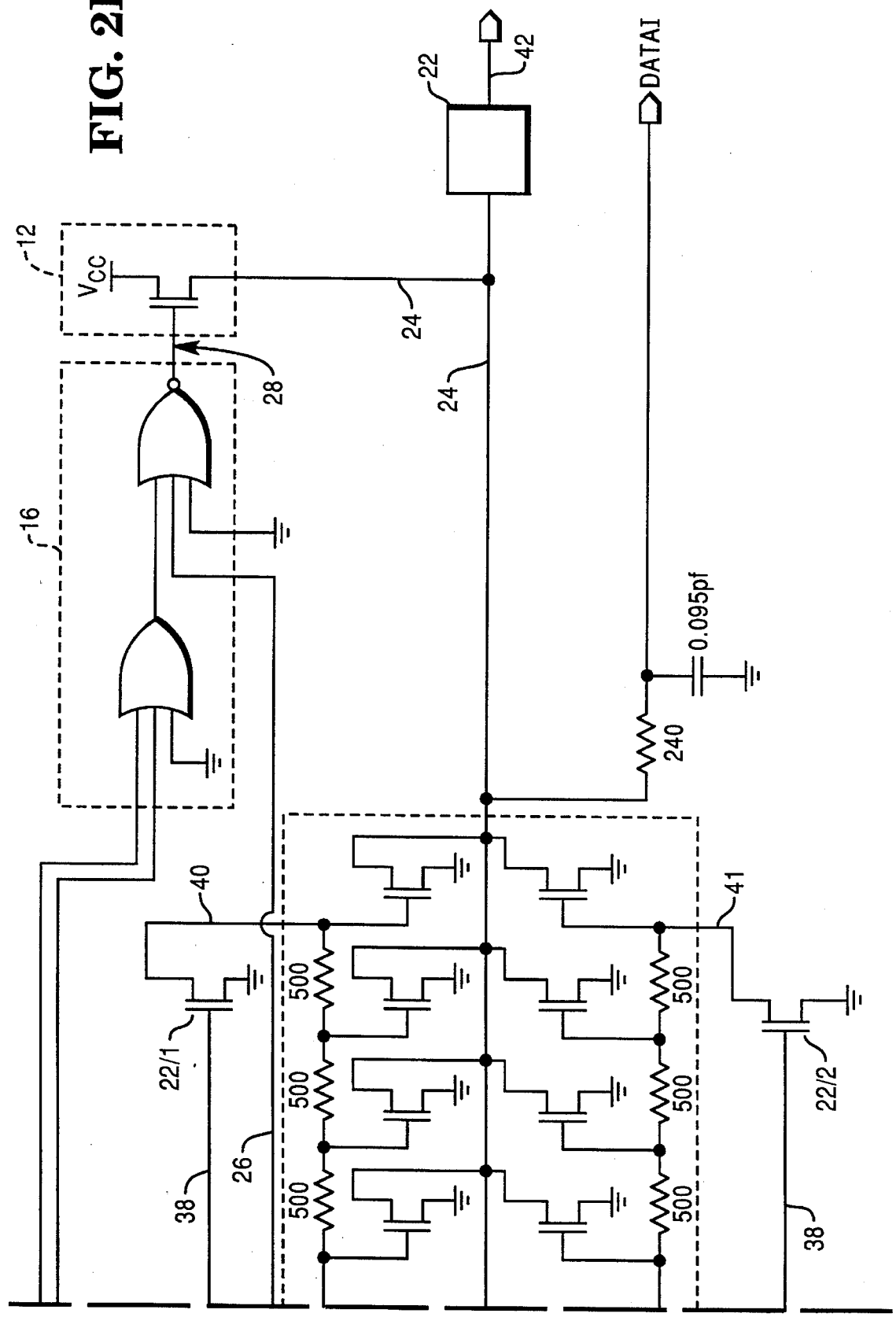
Figure 3:
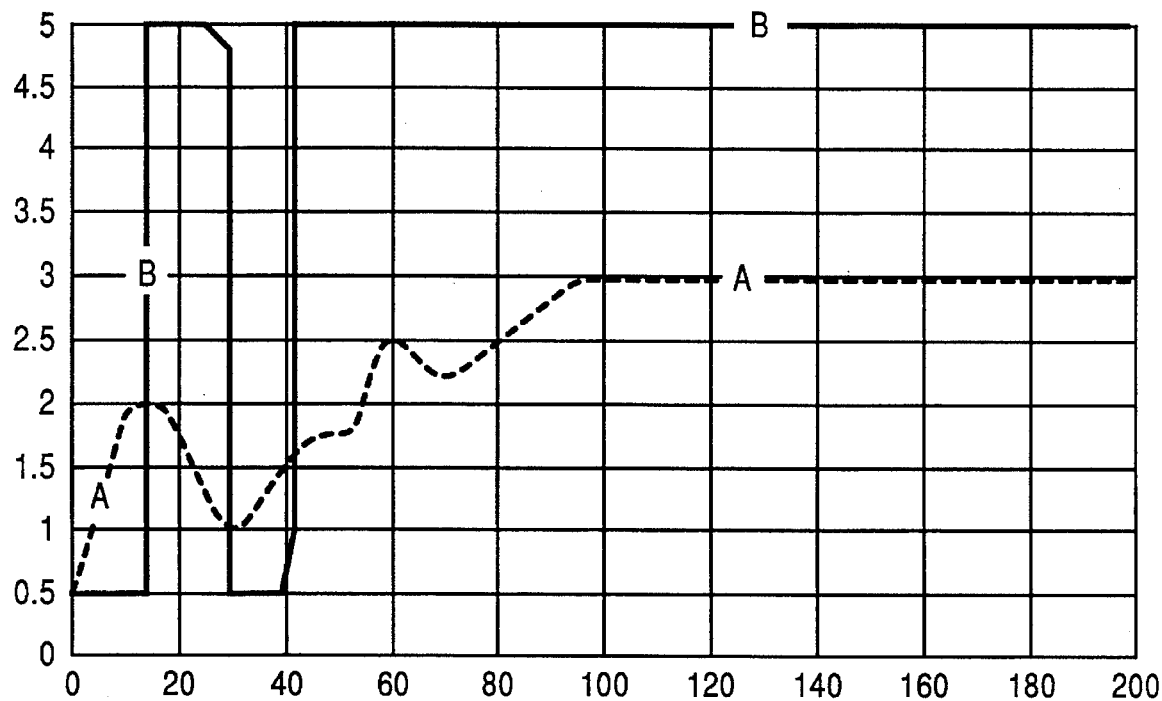
FIG. 3 is a graph illustrating the deassertion of a signal on a bus line and the output of a receiver in response thereto.

A detailed schematic diagram of the preferred embodiment of the invention is shown in FIGS. 2A–2B. A logical bit of information to be transmitted across bus line 42 is supplied to assertion control 20 of the driver circuit 10 via line 34 (it is to be recognized that assertion control 20 can be implemented in configurations other than the embodiment illustrated in FIG. 2).

Assertion Device

Generally, driver circuits experience increased susceptibility to ground bounce problems as high-to-low signal transition times are decreased; the faster the transition time, the higher the ground bounce susceptibility. The assertion device 14 of this invention is a graded pull-down network which, except for the connection of deassertion enable signal 26 discussed in greater detail later, is known in the prior art. Graded pull-down network 14 reduces the susceptibility to ground bounce problems by providing a slew-rate controlled assertion of an active low signal level on bus line 42 which reduces the magnitude of ground bounce induced voltage reflections on the bus line.

Graded pull-down network 14 comprises an upper bank of NMOS transistors 44 and a lower bank of NMOS transistors 46 arranged in an eight-stage configuration wherein the drain terminals of each stage are coupled to bus line 42 via output line 24 and the gate terminals of each stage are coupled to control signal 36 via voltage divider networks 48 and 50.

With reference to FIG. 2, a high bit on input line 34 forces control signal 36 high, thus driving pull-down network 14 into conduction. In operation, when control signal 36 is high, it forward biases the first stage of pull-down network 14 comprised of transistors 44/1 and 46/1. As the first stage of transistors begin sinking current from output line 24, the voltage level of bus line 42 begins to decrease. The remaining stages of the network 44/2 and 46/2, 44/3 and 46/3, etc. are sequentially driven into conduction thus providing a graded turn-on of pull-down network 14 which results in the controlled assertion of a low signal level on bus line 42.

Quick Turn-Off Device

Generally, pull-down network 14 is slow to turn off in response to a low control signal 36 because of its large current handling capability and because of its slew-rate controlled configuration. The difficulty in turning off pull-down network 14 causes a delay in deasserting bus line 42 because active deassertion assist device 12 does not have an appreciable effect on pulling up bus line 42 until pull-down network 14 is almost completely off. This delay is unacceptable because it uses up key time in the duty cycle problem being attacked.

To solve this problem, quick turn-off device 18 assists pull-down network 14 in turning-off in response to quick turn-off signal 38. Quick turnoff signal 38 is generated by assertion control 20 when a low input bit is present on input line 34. Quick turn-off device 18 comprises two NMOS transistors 22/1 and 22/2 having their drain terminals connected to resistive voltage divider networks 48 and 50, respectfully, and having their gate terminals connected to quick turn-off signal line 38.

In operation, a low input signal on input line 34 causes assertion control 20 to reverse bias pull-down network 14 and to generate quick turn-off signal 38 which drives transistors 22/1 and 22/2 into conduction. The transistors 22/1 and 22/2 provide an alterative path to ground via lines 40 and 41, respectively, thereby assisting in reverse biasing transistor banks 44 and 46.

Deassertion Enable Signal

The delay in turning off pull-down network 14 detrimentally affects the power consumption of driver circuit 10 as well. Generally, the only time that power is consumed in a CMOS circuit is when a complete path from Vcc source voltage to ground exists. In driver circuit 10, the only time that a complete path to ground exists is when active deassertion assist device 12 and pull-down network 14 are simultaneously conducting. But for deassertion enable signal 26, the delay incurred in turning off pull-down network 14 would necessarily consume power because at the same time pull-down network 14 would be turning off, active deassertion assist device 12 would be attempting to deassert the low signal level on bus line 42 (assuming that the user has activated the active deassertion assist feature). Thus, a complete path from Vcc to ground would exist every time that a signal transition occurred.

To minimize this conduction overlap, deassertion enable signal 26 provides an active low indication to deassertion control 16 that pull-down network 14 is almost turned off. Deassertion enable signal line 26 is connected to the third stage of pull-down network 14. As transistors 44/3 and 46/3 of transistor banks 44 and 46, respectively, of pull-down network 14 are being reversed biased, a low signal level on line 26 indicates that pull-down network 14 is shutting down, therefore active deassertion assist device 12 can now be activated. This results in active deassertion assist device 12 being delayed in turning on until just before pull-down network 14 is completely shut-off thereby improving the duty cycle while at the same time minimizing power consumption.

As seen in FIG. 2A, deassertion enable signal 26 is connected to the third stage of pull-down network 14. It is to be understood that deassertion enable signal 26 could be connected to other stages of pull-down network 14 and still remain within the scope of this invention.

Active Deassertion Assist Device

In direct contrast to the ground bounce problems associated with asserting an active low signal on bus line 42 is the fact that signal transition edges make up an increasingly significant part of a duty-cycle as data transfer rates are increased (shorter machine-cycle time periods). The time it takes for a signal transition to occur can be so significant that it becomes the limiting factor in achieving higher data transfer rams.

Typically, signal levels are restored by means of passive termination on the bus line. With the demand for higher speed data transfers, the passive termination scheme pulls a bus line up too slowly on reassertion thereby degrading the duty cycle and reducing the noise immunity to dangerous levels. The noise immunity is reduced because passive level restoration cannot pull the bus line up high enough in such a short period of time to provide immunity from the negative voltage spikes that trigger the double-clocking problem.

For the reasons cited above, the driver circuit of the present invention provides an active reassertion assist device 12 to assist terminator circuit 23 in pulling-up bus line 42 via line 24. Active deassertion assist device 12 is energized by deassertion control 16 via line 28 (it is to be recognized that deassertion control 16 can be implemented in configurations other than the embodiment illustrated in FIG. 2). In order for deassertion control 16 to energize active reassertion assist device 12, user enable signal 30, control signal 36, and deassertion enable signal 26 must all be at active low signal levels. Active deassertion assist device 12 merely assists terminator circuit 23 in pulling-up the bus line, rather than being primarily responsible for pulling-up bus line 42. Active deassertion assist device 12 is an NMOS transistor which is selected to eliminate the possibility of voltage feedthrough whereby bus voltages in a wired-or bus configuration can be coupled through a PMOS device on a powered down integrated circuit chip causing erratic operation.

Figure 4:
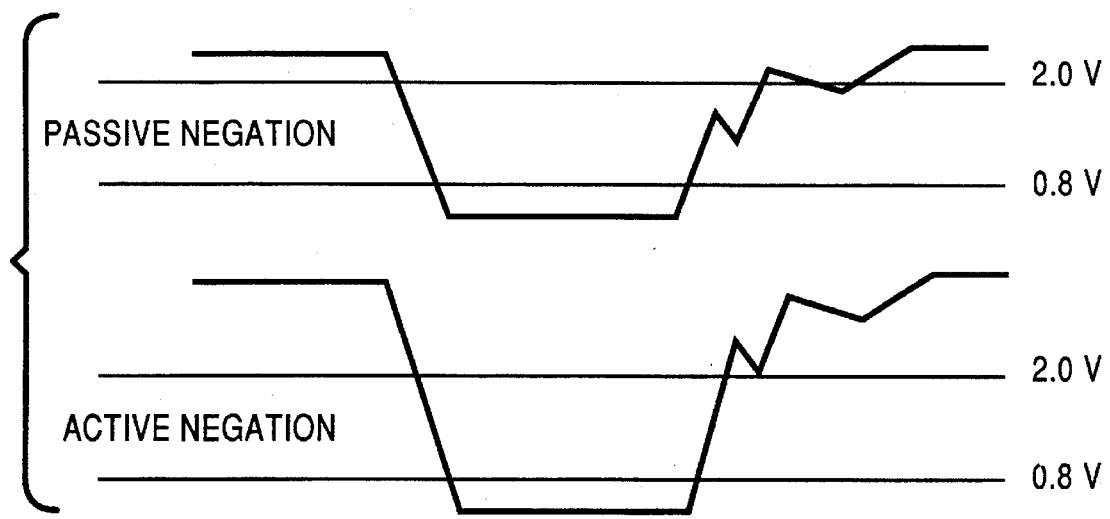
FIG. 4 is a graph illustrating the response of a bus signal to the user selectable active deassertion assist feature of the present invention.

FIG. 4 illustrates the response of a bus signal to the user selectable active deassertion assist feature of the present invention. If the active deassertion assist feature is selected by a user (via register selectable user enable signal 30), bus line 42 will be pulled up to a higher signal level than if bus line 42 was just passively restored by terminator circuit 23 alone. With the active deassertion assist feature selected, negative voltage reflections caused by poor cable design configurations are prevented from causing the bus signal to drop below the receiver threshold level of 2 volts. Without the active deassertion assist feature selected, the bus line cannot obtain the same margin of noise immunity, consequently, negative voltage reflections on the bus line will cause the bus line to drop below the receiver threshold level thereby triggering double-clocking problems.

It can thus be seen that there has been provided by the present invention an improved CMOS driver circuit for driving a fast, single-ended, wired-or bus architecture which operates with shorter machine-cycle time periods; is configurable to handle poor cable design configurations; which reduces the magnitude of voltage reflections that travel across a bus line; and which provides a better high level noise margin thereby preventing negative voltage reflections from causing double-clocking problems.

Although the presently preferred embodiment of the invention has been described, it will be understood that the invention is not limited to these precise forms of apparatus, and that changes may be therein without departing from the scope of the invention which is defined in the appended claims.

What is claimed is:

1. In a CMOS integrated circuit device, a driver circuit for driving a bus line from a first voltage level to a second voltage level, said bus line being coupled to a terminator circuit that restores said bus line to said first voltage level from said second voltage level, said driver circuit comprising:

an active deassertion assist device coupled to said bus line for assisting said terminator circuit in restoring said bus line to said first voltage level from said second voltage level; and a programmable control signal operable to control said active deassertion assist device.

2. The driver circuit as claimed in claim 1, further comprising:

an assertion device coupled to said bus line for asserting said second voltage level on said bus line, said assertion device further including means for generating a first enable signal for signaling when said assertion device has substantially completed asserting said second voltage level on said bus line; and a first control means coupled to receive said first enable signal and coupled to said active deassertion assist device for activating said deassertion assist device in response to said first enable signal.

3. A terminated bus system comprising:

at least one bus line;

a driver circuit coupled to said bus line for driving said bus line from a first voltage level to a second voltage level;

a terminator circuit coupled to said bus line for restoring said bus line to said first voltage level from said second voltage level;

said driver circuit comprising an active deassertion assist device coupled to said bus line for assisting said terminator circuit in restoring said bus line to said first voltage level from said second voltage level; and a programmable control signal operable to control said active deassertion assist device.

4. The terminated bus system as claimed in claim 3, wherein said driver circuit further comprises:

an assertion device coupled to said bus line for asserting said second voltage level on said bus line, said assertion device further including means for generating a first enable signal for signaling when said assertion device has substantially completed asserting said second voltage level on said bus line; and a first control means coupled to receive said first enable signal and coupled to said active deassertion assist device for activating said deassertion assist device in response to said first enable signal.

5. The terminated bus system as claimed in claim 4, wherein said driver circuit further comprises:

a quick turn-off device coupled to said assertion device for quickly turning off said assertion device in response to a turn-off signal.

6. A terminated bus system comprising:

at least one bus line;

a driver circuit coupled to said bus line for driving said bus line from a first voltage level to a second voltage level;

a terminator circuit coupled to said bus line for restoring said bus line to said first voltage level from said second voltage level;

said driver circuit comprising:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a first enable signal for signaling when said assertion device has substantially completed asserting said second voltage level on said bus line;

a first control means coupled to receive said first enable signal and coupled to said active deassertion assist device for activating said deassertion assist device in response to said first enable signal;

a quick turn-off device coupled to said assertion device for quickly turning off said assertion device in response to a turn-off signal; and a second control means coupled to said assertion device for energizing said assertion device in response to an input signal, said second control means further including means for generating said turn-off signal in response to said input signal.

7. The terminated bus system as claimed in claim 6, wherein said driver circuit further comprises a PAD cell for coupling said driver circuit to said bus line.

8. A terminated bus system comprising:

at least one bus line;

a driver circuit coupled to said bus line for driving said bus line from a first voltage level to a second voltage level;

a terminator circuit coupled to said bus line for restoring said bus line to said first voltage level from said second voltage level;

said driver circuit comprising:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a first enable signal for signaling when said assertion device has substantially completed asserting said second voltage level on said bus line;

a first control means coupled to receive said first enable signal and coupled to said active deassertion assist device for activating said deassertion assist device in response to said first enable signal, wherein said first control means is responsive to a second enable signal, said second enable signal permitting a user to enable or disable said active deassertion assist device.

9. The terminated bus system as claimed in claim 4, wherein said assertion device is a graded pull-down network comprising a plurality of N-channel MOS transistors each having a gate, a source, and a drain terminal, said drain terminal of each transistor being coupled to said bus line.

10. The terminated bus system as claimed in claim 4, wherein said active deassertion assist device comprises an N-channel MOS transistor having a gate terminal coupled to said first control means, a source terminal coupled to said bus line, and a drain terminal coupled to a voltage source.

11. The terminated bus system as claimed in claim 3, wherein said active deassertion assist device couples a supply voltage to said terminated bus line.

12. The terminated bus system as claimed in claim 3, wherein a plurality of said driver circuits are coupled to said bus line thereby forming a wired-or bus configuration.

13. The terminated bus system as claimed in claim 3, wherein said terminator circuit passively restores said bus line to said first voltage level by developing a voltage across a resistive voltage divider network.

14. The terminated bus system as claimed in claim 3, wherein said bus line comprises a small computer system interface (SCSI) bus.

15. In a CMOS integrated circuit device including a driver circuit for driving a bus line from a first voltage level to a second voltage level, said bus line being coupled to a terminator circuit that passively restores said bus line to said first voltage level from said second voltage level, a method comprising the step of:

actively assisting said terminator circuit in restoring said bus line to said first voltage level from said second voltage level as determined by a user programmable control signal.

16. In a CMOS integrated circuit device including a driver circuit for driving a bus line from a first voltage level to a second voltage level, said driver circuit comprising an assertion device coupled to said bus line for asserting said second voltage level on said bus line, said bus line being coupled to a terminator circuit that passively restores said bus line to said first voltage level from said second voltage level, a method comprising the steps of:

generating a control signal for signaling when said assertion device has substantially completed asserting said second voltage level on said bus line; and actively assisting said terminator circuit in restoring said bus line to said first voltage level from said second voltage level in response to said control signal as determined by a programmable control signal.

17. The driver circuit as claimed in claim 1, further comprising:

an assertion device coupled to said bus line for asserting said second voltage level on said bus line, said assertion device further including means for generating a control signal to control said active deassertion assist device.

18. The terminated bus system as claimed in claim 3, further comprising:

an assertion device coupled to said bus line for asserting said second voltage level on said bus line, said assertion device further including means for generating a control signal to control said active deassertion assist device.

19. The terminated bus system as claimed in claim 18, wherein said driver circuit further comprises:

a quick turn-off device coupled to said assertion device for quickly turning off said assertion device in response to a turn-off signal.

20. A terminated bus system comprising:

at least one bus line;

a driver circuit coupled to said bus line for driving said bus line from a first voltage level to a second voltage level;

a terminator circuit coupled to said bus line for restoring said bus line to said first voltage level from said second voltage level;

said driver circuit comprising:

an active deassertion assist device coupled to said bus line for assisting said terminator circuit in restoring said bus line to said first voltage level from said second voltage level; and an assertion device coupled to said bus line for asserting said second voltage level on said bus line, said assertion device further including means for generating a control signal to control said active deassertion assist device;

a quick turn-off device coupled to said assertion device for quickly turning off said assertion device in response to a turn-off signal; and a second control means coupled to said assertion device for energizing said assertion device in response to an input signal, said second control means further including means for generating said turn-off signal in response to said input signal.

21. A terminated bus system comprising:

at least one bus line;

a driver circuit coupled to said bus line for driving said bus line from a first voltage level to a second voltage level;

a terminator circuit coupled to said bus line for restoring said bus line to said first voltage level from said second voltage level;

said driver circuit comprising:

an active deassertion assist device coupled to said bus line for assisting said terminator circuit in restoring said bus line to said first voltage level from said second voltage level; and an assertion device coupled to said bus line for asserting said second voltage level on said bus line, said assertion device further including means for generating a control signal to control said active deassertion assist device, wherein said first control means is responsive to a second enable signal, said second enable signal permitting a user to enable or disable said active deassertion assist device.

22. The terminated bus system as claimed in claim 18, wherein said assertion device is a graded pull-down network comprising a plurality of N-channel MOS transistors each having a gate, a source, and a drain terminal, said drain terminal of each transistor being coupled to said bus line.

23. The terminated bus system as claimed in claim 18, wherein said active deassertion assist device comprises an N-channel MOS transistor having a gate terminal coupled to said first control means, a source terminal coupled to said bus line, and a drain terminal coupled to a voltage source.

24. The method according to claim 15, wherein:

said driver circuit further comprises an assertion device coupled to said bus line for asserting said second voltage level on said bus line;

said method further comprising the steps of:

generating a first enable signal for signaling when said assertion device has substantially completed asserting said second voltage level on said bus line; and actively assisting said terminator circuit in restoring said bus line to said first voltage level from said second voltage level in response to said control signal.

25. In a CMOS integrated circuit device, a driver circuit for driving a bus line from a first voltage level to a second voltage level, said bus line being coupled to a terminator circuit that restores said bus line to said first voltage level from said second voltage level, said driver circuit comprising:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a first control signal for signaling when said assertion device has substantially completed asserting said second voltage level on said bus line;

a control means coupled to said assertion device for energizing said assertion device in response to an input signal, said control means further including means for generating a second control signal; and a first control means coupled to receive said first and second control signals, and coupled to said active deassertion assist device, for controlling said deassertion assist device in response to said first and second control signals.

26. In a CMOS integrated circuit device, a driver circuit for driving a bus line from a first voltage level to a second voltage level, said bus line being coupled to a terminator circuit that restores said bus line to said first voltage level from said second voltage level, said driver circuit comprising:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a control signal to control said active deassertion assist device; and a control means coupled to said assertion device for energizing said assertion device in response to an input signal, said control means further including means for generating a second control signal to control said active deassertion assist device.

27. A terminated bus system comprising:

at least one bus line;

a driver circuit coupled to said bus line for driving said bus line from a first voltage level to a second voltage level; and a terminator circuit coupled to said bus line for restoring said bus line to said first voltage level from said second voltage level;

said driver circuit comprising:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a first control signal for signaling when said assertion device has substantially completed asserting said second voltage level on said bus line;

a control means coupled to said assertion device for energizing said assertion device in response to an input signal, said control means further including means for generating a second control signal; and a first control means coupled to receive said first and second control signals, and coupled to said active deassertion assist device, for controlling said deassertion assist device in response to said first and second control signals.

28. The terminated bus system as claimed in claim 27, wherein said driver circuit further comprises:

a quick turn-off device coupled to said assertion device for quickly turning off said assertion device in response to a turn-off signal.

29. The terminated bus system as claimed in claim 28, wherein said control means further including means for generating said turn-off signal in response to said input signal.

30. The terminated bus system as claimed in claim 29, wherein said driver circuit comprises a PAD cell for coupling said driver circuit to said bus line.

31. The terminated bus system as claimed in claim 27, wherein said first control means is responsive to an enable signal, said enable signal permitting a user to enable or disable said active deassertion assist device.

32. The terminated bus system as claimed in claim 27, wherein said assertion device is a graded pull-down network comprising a plurality of N-channel MOS transistors each having a gate, a source, and a drain terminal, said drain terminal of each transistor being coupled to said bus line.

33. The terminated bus system as claimed in claim 27, wherein said active deassertion assist device comprises an N-channel MOS transistor having a gate terminal coupled to said first control means, a source terminal coupled to said bus line, and a drain terminal coupled to a voltage source.

34. A terminated bus system comprising:

at least one bus line;

a driver circuit coupled to said bus line for driving said bus line from a first voltage level to a second voltage level; and a terminator circuit coupled to said bus line for restoring said bus line to said first voltage level from said second voltage level; wherein said driver circuit comprises:

an active deassertion assist device coupled to said bus line for assisting said terminator circuit in restoring said bus line to said first voltage level from said second voltage level;

an assertion device coupled to said bus line for asserting said second voltage level on said bus line, said assertion device further including means for generating a control signal to control said active deassertion assist device; and a control means coupled to said assertion device for energizing said assertion device in response to an input signal, said control means further including means for generating a second control signal to control said active deassertion assist device.

35. The terminated bus system as claimed in claim 34, wherein said driver circuit further comprises:

a quick turn-off device coupled to said assertion device for quickly turning off said assertion device in response to a turn-off signal.

36. The terminated bus system as claimed in claim 35, wherein said control means further including means for generating said turn-off signal in response to said input signal.

* * * * *